United States Patent
Oh

(10) Patent No.: US 11,248,309 B2
(45) Date of Patent: Feb. 15, 2022

(54) SINGLE CRYSTAL INGOT USING BARIUM ZIRCONIUM OXIDE AND PREPARATION METHOD THEREFOR

(71) Applicant: UNIST(ULSAN NATIONAL INSTITUTE OF SCIENCE AND TECHNOLOGY), Ulsan (KR)

(72) Inventor: Yoon Seok Oh, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 16/979,369

(22) PCT Filed: May 30, 2019

(86) PCT No.: PCT/KR2019/006502
§ 371 (c)(1),
(2) Date: Sep. 9, 2020

(87) PCT Pub. No.: WO2019/245187
PCT Pub. Date: Dec. 26, 2019

(65) Prior Publication Data
US 2021/0002784 A1    Jan. 7, 2021

(30) Foreign Application Priority Data

Jun. 22, 2018 (KR) .......................... 10-2018-0071967

(51) Int. Cl.
- C30B 13/24 (2006.01)
- C30B 29/22 (2006.01)
- H01L 29/24 (2006.01)

(52) U.S. Cl.
CPC .............. *C30B 13/24* (2013.01); *C30B 29/22* (2013.01); *H01L 29/24* (2013.01)

(58) Field of Classification Search
CPC ......... C30B 13/16; C30B 13/22; C30B 13/24; C30B 29/22; H01L 29/24
See application file for complete search history.

(56) References Cited

FOREIGN PATENT DOCUMENTS

| JP | H04-132675 A | 5/1992 |
|----|--------------|--------|
| JP | 2001-139390 A | 5/2001 |

(Continued)

OTHER PUBLICATIONS

International Search Report for PCT/KR2019/006502 dated Aug. 26, 2019 from Korean Intellectual Property Office.

(Continued)

*Primary Examiner* — Robert M Kunemund
(74) *Attorney, Agent, or Firm* — Paratus Law Group, PLLC

(57) ABSTRACT

Disclosed is a method of preparing single crystal ingot of barium zirconium oxide. The method includes preparing a cylindrical BaZrO₃ ceramic by pulverizing a BaZrO₃ compound into a powder and sintering the same into a cylindrical ceramic form, ii) fixing two cylindrical BaZrO₃ ceramics to an optical floating zone furnace, joining the two cylindrical BaZrO₃ ceramics together and melting the junction at a temperature of 2,600 to 3,500° C. using light emitted from a xenon lamp or laser, and after the melting, moving the two cylindrical BaZrO₃ ceramics in a direction parallel to an axis of rotation thereof, enabling the molten junction to be solidified, and thereby growing a single crystal.

4 Claims, 4 Drawing Sheets

(56) References Cited

FOREIGN PATENT DOCUMENTS

| JP | 2002-265263 A | 9/2002 |
|---|---|---|
| KR | 10-2005-0007857 A | 1/2005 |
| KR | 10-1750688 B1 | 6/2017 |

OTHER PUBLICATIONS

Matthias Stephan Paun, M.SC., "Single Crystal Growth of High Melting Oxide Materials by Means of Induction Skull-Melting", Technische Universitat Berlin Doctoral Thesis, 2015, pp. 1-139.

SYNTHESIS OF BaZrO$_3$ COMPOUND

PREPARATION OF CYLINDRICAL BaZrO$_3$ CERAMIC

GROWTH OF PREPARED CYLINDRICAL BaZrO$_3$ CERAMIC INTO SINGLE CRYSTAL USING OPTICAL FLOATING ZONE FURNACE

SINGLE CRYSTAL INGOT USING BARIUM ZIRCONIUM OXIDE AND PREPARATION METHOD THEREFOR

CROSS-REFERENCE TO PRIOR APPLICATIONS

This application is a National Stage Patent Application of PCT International Patent Application No. PCT/KR2019/006502 (filed on May 30, 2019) under 35 U.S.C. § 371, which claims priority to Korean Patent Application No. 10-2018-0071967 (filed on Jun. 22, 2018), which are all hereby incorporated by reference in their entirety.

BACKGROUND

The present invention relates to a barium zirconium oxide ($BaZrO_3$) single crystal ingot prepared by using an optical floating zone furnace employing a xenon lamp or laser as a light source. A method of preparing a $BaZrO_3$ single crystal ingot exhibits excellent crystallinity by melting a $BaZrO_3$ ceramic at a high temperature of up to 3,500° C. by using an optical floating zone furnace employing a xenon lamp or laser as a light source.

On the recent development of information technology, as increasing the demand for advanced devices made of emergent semiconductor thin films, techniques to enhance performance and functionality of semiconductor devices have been continuously developed. Wafer and substrate are very important parameters to determine physical property, functionality, and performance of the semiconductor thin film. Semiconductor thin-film devices utilize exotic physical phenomena on emerging at the nanoscale, and wafers based on the nanoscale device fabrication are a critical factor in determining the physical properties of the devices.

Among the wafers for depositing thin films, silicon is the most successful and most widely used, but in order to fabricate devices having characteristics specialized for specific purposes, thin-film devices have also been fabricated using various compound wafers other than silicon and used. In particular, the compound wafers other than silicon may exhibit unique physical properties that are not realizable with silicon wafers or may have excellent physical properties. Therefore, to improve the performance of existing devices and overcome limitations thereof, there has been a continued need for the development of wafers made of new compounds.

Korean Patent Registration No. 1750688 discloses a silicon single crystal wafer manufactured through heat treatment at a temperature of 1,150 to 1,300° C. by the Czochralski method. Although many silicon wafers and various compound wafers are manufactured by the Czochralski method and the method has the advantage of growing a large-area single crystal, the method has a limitation in that it cannot synthesize compounds having a melting point of 2,200° C. or more into single crystals.

SUMMARY

As a result of intensive research in regard to a single crystal ingot prepared using barium zirconium oxide according to the present invention and a method of preparing the same to solve the above-described problems, it has been found that it is possible to prepare a single crystal ingot using barium zirconium oxide ($BaZrO_3$) with a melting point of 2,200° C. or more, and specifically, to prepare an ingot exhibiting excellent crystallinity by melting $BaZrO_3$ at a temperature of up to 3,500° C. by using an optical floating zone furnace employing a xenon lamp or laser as a light source, and thereby the present invention is completed.

Therefore, the present invention is directed to providing a barium zirconium oxide ($BaZrO_3$) single crystal ingot exhibiting excellent crystallinity and a method of preparing the same.

One aspect of the present invention provides a method of preparing a single crystal ingot using barium zirconium oxide, which includes:

i) preparing a cylindrical $BaZrO_3$ ceramic by pulverizing a $BaZrO_3$ compound into a powder and sintering the same into a cylindrical ceramic form;

ii) fixing two cylindrical $BaZrO_3$ ceramics to an optical floating zone furnace;

iii) joining the two cylindrical $BaZrO_3$ ceramics together and melting the junction at a temperature of 2,600° C. to 3,500° C. using light emitted from a xenon lamp or laser; and iv) after the melting, moving the two cylindrical $BaZrO_3$ ceramics in a direction parallel to an axis of rotation thereof, enabling the molten junction to be solidified, and thereby growing a single crystal.

Another aspect of the present invention provides an apparatus for preparing a single crystal ingot using barium zirconium oxide, which includes:

a feed portion for supplying barium zirconium oxide ($BaZrO_3$);

a seed portion for growing barium zirconium oxide ($BaZrO_3$);

a joining portion where the feed portion and the seed portion are in contact; and a light source unit for supplying light to the joining portion.

According to the present invention, not only is it possible to provide a single crystal size that allows for the growth of a new epitaxial thin film enabling a $BaZrO_3$ single crystal to be used as a wafer, but it is also possible to prepare a $BaZrO_3$ single crystal ingot exhibiting excellent crystallinity.

In addition, since an optical floating zone furnace employing a xenon lamp or laser as a light source is used, the problem that the existing Czochralski method cannot synthesize a compound having a melting point of 2,200° C. or more into a single crystal is overcome, and it is possible to obtain a single crystal ingot grown from a compound having a high melting point.

DETAILED DESCRIPTION

Hereinafter, the present invention will be described in more detail.

The method of preparing a single crystal ingot using barium zirconium oxide according to one embodiment of the present invention includes:

i) preparing a cylindrical $BaZrO_3$ ceramic by pulverizing a $BaZrO_3$ compound into a powder and sintering the same into a cylindrical ceramic form;

ii) fixing two cylindrical $BaZrO_3$ ceramics to an optical floating zone furnace;

iii) joining the two cylindrical $BaZrO_3$ ceramics together and melting the junction at a temperature of 2,600° C. to 3,500° C. using light emitted from a xenon lamp or laser; and iv) after the melting, moving the two cylindrical $BaZrO_3$ ceramics in a direction parallel to an axis of rotation thereof, enabling the molten junction to be solidified, and thereby growing a single crystal.

According to one embodiment of the present invention, the $BaZrO_3$ compound may be obtained through firing and sintering at 1,000 to 1,750° C. using a solid state reaction method.

The $BaZrO_3$ compound synthesized by the solid state reaction method may be pulverized into a powder having a particle size of 100 m or less and then molded into a cylindrical ceramic form having a length of 80 mm or more and sintered to synthesize a cylindrical $BaZrO_3$ ceramic.

Existing materials made of perovskite oxides and used as ingots may be classified according to the magnitude of lattice constants and the lattice structure of the materials. The existing materials have lattice constants of 3.7 to 4.0 Å, and structurally, only three materials, $SrTiO_3$ (~3.91 Å), LSAT (~3.87 Å), and $KTaO_3$ (a~3.989 Å), are cubic, and dozens of other perovskite oxide ingots are orthorhombic.

The $BaZrO_3$ compound of the present invention has a very large lattice constant of 4.2 Å and is cubic, and thus enables the growth of epitaxial thin films with a large lattice constant that could not be grown until now. In addition, due to having a cubic structure, the $BaZrO_3$ compound enables a thin film to grow without distortion.

Figure 1:
FIG. 1 is a flow chart illustrating a method of growing a single crystal according to one embodiment of the present invention.
Figure 1:
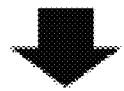
Figure 2:
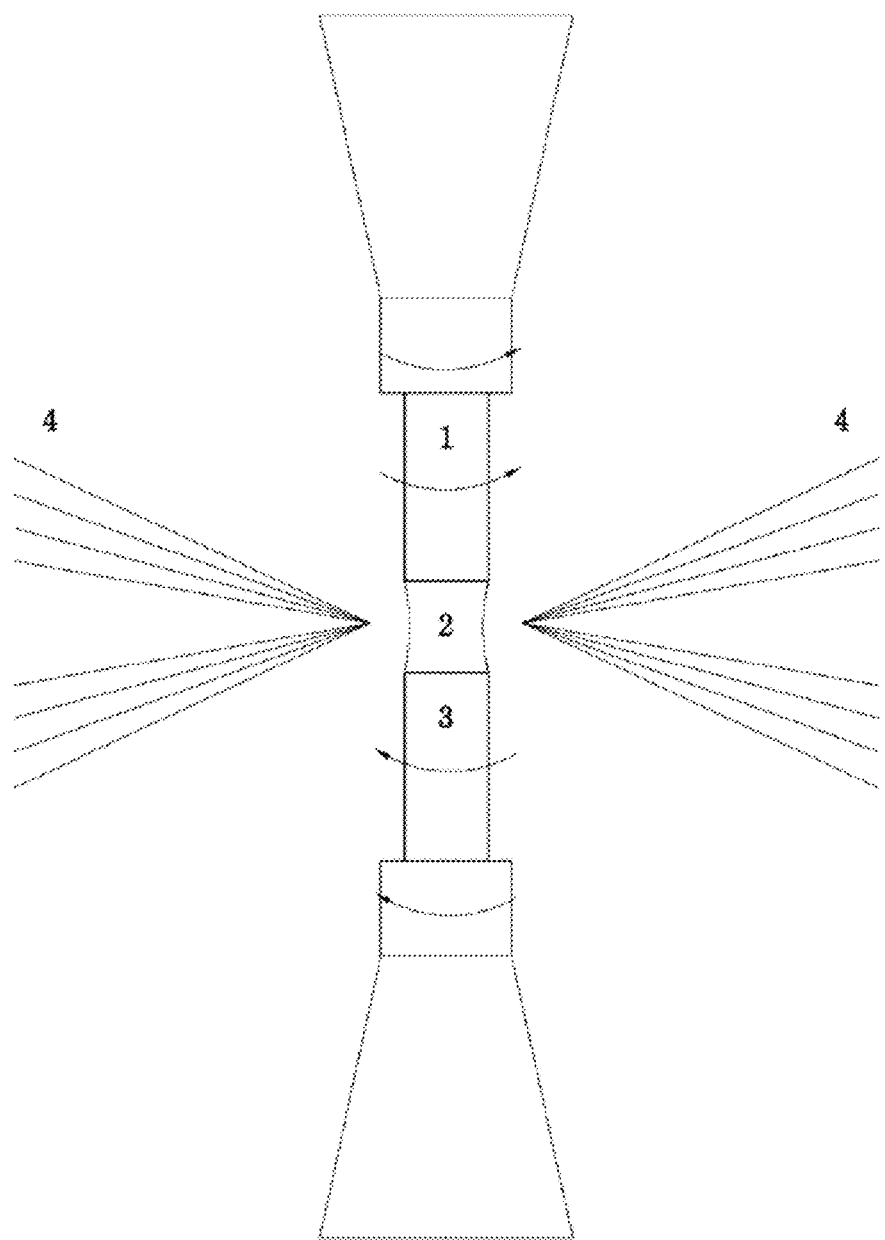
FIG. 2 is an image illustrating a method of growing a single crystal according to one embodiment of the present invention.

The $BaZrO_3$ single crystal of the present invention is grown using two cylindrical $BaZrO_3$ ceramics, one of which is a seed rod 3, and the other is a feed rod 1. The seed rod 3 and the feed rod 1 are fixed to a chuck of an optical floating zone furnace (see FIG. 2).

The optical floating zone furnace employing a xenon lamp according to the present invention is designed such that two or four concave mirrors collect light at one central point, wherein at the point of focus, the density of light energy is maximized and thermal energy is maximized accordingly. At the point where the light is focused, the seed rod and the feed rod meet and melt. The region where the seed rod and the feed rod meet and melt is referred to as a molten zone 2 (see FIG. 2). Generally, the seed rod and the feed rod are rotated in opposite directions at a speed of 0 to 60 rpm. When the seed rod and the feed rod are moved downward at a speed of 5 to 60 mm/hr simultaneously with the rotation, as the rods gradually move out of the molten zone, thermal energy decreases, and as the temperature of the seed rod which has left the molten zone gradually decreases, a crystal is formed. In the early stage of growth, crystal nucleation is initiated in several places, but due to the most dominant crystal nucleus thereamong, the nuclei grow into a single crystal.

According to one embodiment of the present invention, the two cylindrical $BaZrO_3$ ceramics are joined together, and the junction is exposed to light 4 emitted from a xenon lamp or laser. Here, the light generates 2,600° C. to 3,500° C. heat and thereby melts a compound having a high melting point, such as $BaZrO_3$ of the present invention (see FIG. 2).

The optical floating zone furnace employing a xenon lamp or laser may apply a thermal energy of 4 kW per hour to the seed rod and the feed rod. Theoretically, for the same thermal energy supplied, the smaller the molten zone, the higher the temperature can be reached, but the smaller the size of the molten zone, the smaller the size of an ingot, and the lower the value of the ingot as a substrate. Therefore, based on an ingot having a diameter of 8 mm, it is possible to raise the temperature of the molten zone to a maximum of 3,500° C. using a thermal energy of 1 to 4 kW.

In the process of crystallizing the molten ceramics, in order to ensure that molecules are accurately and periodically arranged to achieve excellent crystallinity, one of the two cylindrical $BaZrO_3$ ceramics is rotated clockwise while the other is rotated counterclockwise such that they rotate at a speed of 0 to 50 rpm at the same time as the melting process is performed, and the ceramics are moved at a speed of 5 to 60 mm/hr in a direction parallel to the axis of rotation so that they can come into contact with each other.

While the crystal growth is in progress, melting continues in the molten zone. While the melting is continued in the molten zone, the two cylindrical $BaZrO_3$ ceramics are moved in a direction parallel to the axis of rotation, and as a molten compound which has left the molten zone is solidified, a single crystal grows.

The single crystal ingot prepared using barium zirconium oxide according to one embodiment of the present invention is grown using an optical floating zone furnace employing a xenon lamp or laser as a light source and thus has excellent crystallinity despite being grown at an extremely high temperature. At extremely high temperatures, compounds evaporate or are vaporized instead of being stabilized and thus do not follow the chemical formula of a compound to be grown, and this leads to degradation of crystallinity. However, the barium zirconium oxide single crystal ingot grown in the present invention has excellent crystallinity despite being grown at an extremely high temperature of 2,600 to 3,500° C.

In addition, the present invention relates to an apparatus for preparing a single crystal ingot using barium zirconium oxide, and according to one embodiment of the present invention, the apparatus for preparing a single crystal ingot includes:

a feed portion for supplying barium zirconium oxide ($BaZrO_3$);

a seed portion for growing barium zirconium oxide ($BaZrO_3$);

a joining portion where the feed portion and the seed portion are in contact; and a light source unit for supplying light to the joining portion.

According to one embodiment of the present invention, the light source is a xenon lamp or laser, and the single crystal ingot is prepared in an optical floating zone furnace.

The single crystal ingot prepared using barium zirconium oxide according to one embodiment of the present invention is usable as a semiconductor wafer.

Hereinafter, the present invention will be described in more detail by way of exemplary embodiments. The exemplary embodiments are merely illustrative of the present invention, and it is apparent to those skilled in the art that the scope of the present invention is not limited to the exemplary embodiments.

Example 1: Growth of Barium Zirconium Oxide (BaZrO₃) Single Crystal Ingot

Example 1-1: Preparation of Barium Zirconium Oxide (BaZrO₃) Ceramic

In order to grow a BaZrO$_3$ single crystal, a BaZrO$_3$ compound was first prepared.

The BaZrO$_3$ compound was synthesized by firing and sintering a mixture of BaCO$_3$ and ZrO$_2$ or a mixture of BaO and ZrO$_2$ at a temperature of 1,000 to 1,750° C. using a solid state reaction method. Once synthesized, the BaZrO$_3$ compound was pulverized into a powder having a particle size of 100 m or less, molded into a cylindrical ceramic form having a length of 80 mm or more, and then sintered to synthesize a cylindrical BaZrO$_3$ ceramic.

Example 1-2: Growth of Barium Zirconium Oxide (BaZrO₃) Single Crystal

Initial BaZrO$_3$ single crystal synthesis involved the growth of a single crystal using two cylindrical BaZrO$_3$ ceramics.

One of the cylindrical ceramics was a seed rod, the other was a feed rod, and the ceramics were fixed to an optical floating zone furnace. Subsequently, light emitted from a xenon lamp or laser under a high gas pressure of 1 bar or more was concentrated at the junction of the seed rod and the feed rod so that the cylindrical BaZrO$_3$ ceramics melted at a temperature of 2,600 to 3,500° C. In this case, one of the feed rod and the seed rod, which were respectively above and below the melting region, was rotated clockwise while the other was rotated counterclockwise, at a rotational speed of 0 to 50 rpm. Simultaneously with the rotation, the seed rod and the feed rod were melted while being moved at a speed of 5 to 60 mm/hr in a direction parallel to the axis of rotation so that they could come into contact with each other.

While the crystal growth was in progress, the melting of the molten zone continued. While the melting was continued in the molten zone, the two cylindrical BaZrO$_3$ ceramics were moved downward along the axis of rotation, so that the molten BaZrO$_3$ compound was moved out of the molten zone. As the temperature thereof was gradually decreased, the molten BaZrO$_3$ was solidified, and thereby a BaZrO$_3$ single crystal grown to a size of 1 mm$^3$ or more was obtained.

Comparative Example 1: Growth of Silicon Single Crystal Ingot

A silicon single crystal ingot was grown by the Czochralski method. Here, the silicon single crystal ingot was grown to have an initial oxygen concentration of 5 ppma, and was grown while adding carbon at a concentration of 2×10$^{16}$ atoms/cm$^3$ and nitrogen at a concentration of 4×10$^{13}$ atoms/cm$^3$ thereto.

Experimental Example 1: Crystallinity Measurement of Single Crystal Ingot

The crystallinity of a single crystal ingot was quantified using the full width at half maximum (FWHM) value of a Bragg diffraction peak obtained from rocking-curve measurement.

Figure 3:
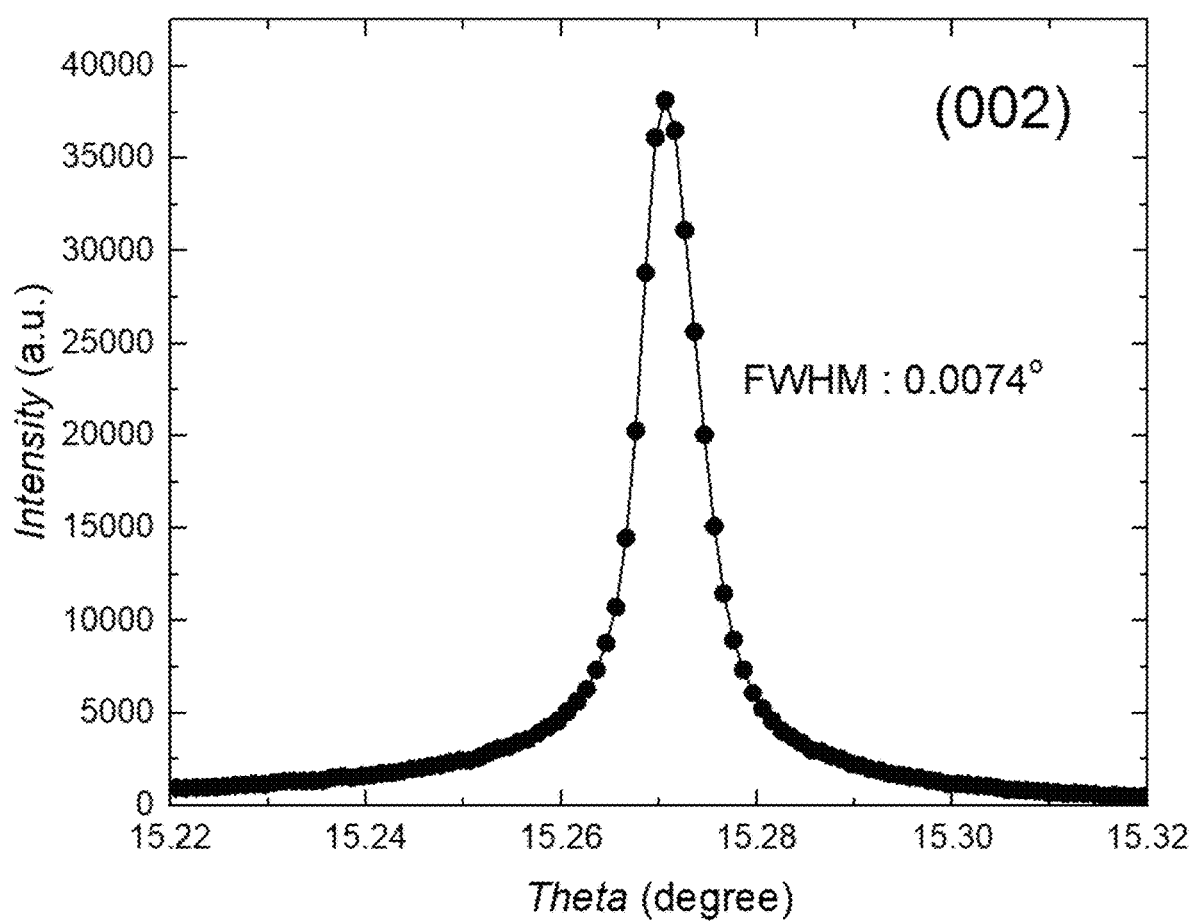
FIG. 3 is experimental data generated as a rocking curve of the (002) Bragg peak to quantitatively determine the crystallinity of a surface of a single crystal obtained in the present invention.
Figure 4:
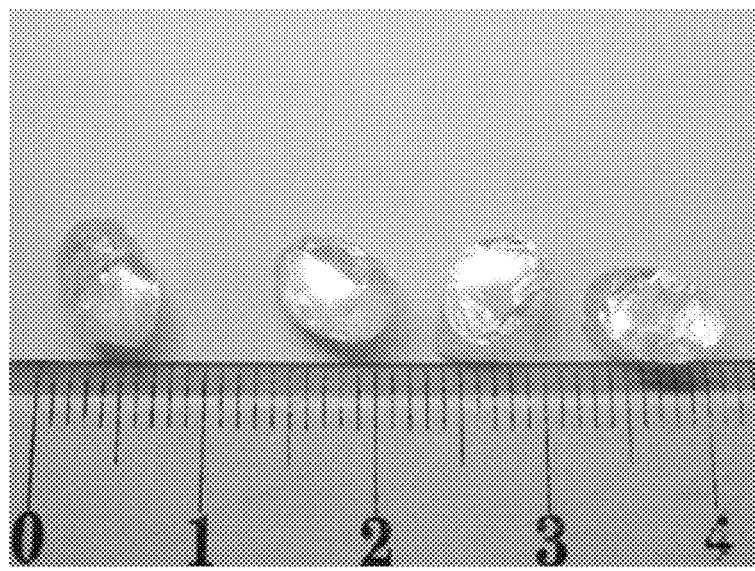
FIG. 4 is a photograph showing a single crystals ingot grown in the present invention.

It was observed that the barium zirconium oxide single crystal ingot of Example 1 according to the present invention had an FWHM of 0.0074° (see FIG. 3). Based on the fact that single crystal ingots such as commercialized silicon, SrTiO$_3$, and MgO have the FWHMs of 0.002° to 0.008°, it can be found that the barium zirconium oxide single crystal ingot grown in the present invention ensures a commercially available level of crystallinity.

Since the barium zirconium oxide single crystal ingot of Example 1 according to the present invention had excellent crystallinity despite being grown at an extremely high temperature of 2,600 to 3,500° C., the barium zirconium oxide single crystal ingot is applicable to thin-film devices using various compound wafers other than silicon for specific purposes.

While specific aspects of the present invention have been described in detail above, it is obvious to those skilled in the art to which the present invention pertains that the above-described specific techniques are only exemplary embodiments and the scope of the present invention is not limited to the exemplary embodiments. Those skilled in the art to which the present invention pertains will be able to make various applications and modifications within the scope of the present invention based on the description of the present invention.

Therefore, the substantial scope of the present invention will be defined by the appended claims and their equivalents.

The barium zirconium oxide (BaZr$_3$) single crystal ingot of the present invention is applicable to the field of semiconductor thin-film devices.

The invention claimed is:

1. A method of preparing single crystal ingot of barium zirconium oxide, comprising:
    i) preparing a cylindrical BaZrO$_3$ ceramic by pulverizing a BaZrO$_3$ compound into a powder and sintering the same into a cylindrical ceramic form;
    ii) fixing two cylindrical BaZrO$_3$ ceramics in an optical floating zone furnace;
    iii) joining the two cylindrical BaZrO$_3$ ceramics together and melting the junction at a temperature of 2,600 to 3,500° C. using light emitted from a xenon lamp or laser; and
    iv) after the melting, moving the two cylindrical BaZrO$_3$ ceramics in a direction parallel to an axis of rotation thereof, enabling the molten junction to be solidified, and thereby growing a single crystal.

2. The method of claim 1, wherein the BaZrO$_3$ compound is prepared by firing and sintering at a temperature of 1,000 to 1,750° C. using a solid state reaction method.

3. The method of claim 1, wherein, in the step iii), one of the two cylindrical BaZrO$_3$ ceramics is rotated clockwise while the other is rotated counterclockwise such that they rotate at a speed of 0 to 50 rpm.

4. The method of claim 3, wherein, in the step iii), simultaneously with the rotation, the two cylindrical BaZrO$_3$ ceramics are moved at a speed of 5 to 60 mm/hr in a direction parallel to the axis of rotation so that the ceramics come into contact with each other.

* * * * *